(12) United States Patent
Shimirak

(10) Patent No.: US 7,303,426 B2
(45) Date of Patent: Dec. 4, 2007

(54) BRIDGING CONNECTOR

(75) Inventor: Gerald L. Shimirak, Winchester, CA (US)

(73) Assignee: Channell Commercial Corporation, Temecula, CA (US)

(*) Notice: Subject to any disclaimer, the term of this patent is extended or adjusted under 35 U.S.C. 154(b) by 0 days.

(21) Appl. No.: 11/357,686

(22) Filed: Feb. 16, 2006

(65) Prior Publication Data

US 2006/0178034 A1    Aug. 10, 2006

Related U.S. Application Data

(63) Continuation-in-part of application No. 10/799,338, filed on Mar. 12, 2004, now Pat. No. 7,018,230.

(51) Int. Cl.
*H01R 4/24* (2006.01)

(52) U.S. Cl. ..................................... 439/409

(58) Field of Classification Search ............... 439/409, 439/410, 417–418, 402, 404, 395, 942
See application file for complete search history.

(56) References Cited

U.S. PATENT DOCUMENTS

| | | | |
|---|---|---|---|
| 4,431,241 A | 2/1984 | Hazelhurst | |
| 5,112,245 A | 5/1992 | Shimirak et al. | |
| 5,399,100 A | 3/1995 | Dooley et al. | |
| 5,417,583 A * | 5/1995 | Ishizaki et al. | 439/409 |
| 5,515,436 A | 5/1996 | Bonvallat | |
| 5,662,493 A * | 9/1997 | Reichle | 439/409 |
| 5,947,761 A * | 9/1999 | Pepe | 439/409 |
| 6,015,312 A | 1/2000 | Escane | |
| 6,077,112 A | 6/2000 | Daoud et al. | |
| 6,080,006 A * | 6/2000 | Broder | 439/409 |
| 6,099,343 A | 8/2000 | Bonvallat et al. | |
| 6,123,566 A | 9/2000 | Daoud et al. | |
| 6,193,556 B1 | 2/2001 | Escane | |
| 6,196,862 B1 | 3/2001 | Dooley | |
| 6,247,959 B1 | 6/2001 | Daoud et al. | |
| 6,283,785 B1 | 9/2001 | Daoud | |

(Continued)

FOREIGN PATENT DOCUMENTS

DE    28 14 018    10/1979

(Continued)

OTHER PUBLICATIONS

3M Scotchlok Connectors and Tools Instructions, Jul. 1994, Issue 2, 80-6107-4684-6, 6 pgs.

(Continued)

*Primary Examiner*—J. F. Duverne
(74) *Attorney, Agent, or Firm*—Buchanan Ingersoll & Rooney PC

(57) ABSTRACT

A stackable bridging connector having a pair of contact members, each comprising a first termination end and a second termination end and a connector having a pair of wire receiving passages. The first termination end is dimensioned to be received in a pair of receiving ports of an electrical connector. The wire receiving passages are movable between a first position in which a pair of wires are held apart from the second termination end and a second position in which the pair of wires are inserted into the second termination end.

33 Claims, 14 Drawing Sheets

U.S. PATENT DOCUMENTS

| | | |
|---|---|---|
| 6,296,515 B1 | 10/2001 | Daoud |
| 6,302,723 B1 | 10/2001 | Baum et al. |
| 6,457,990 B1 | 10/2002 | Daoud |
| 6,572,399 B2 | 6/2003 | Shimirak |

FOREIGN PATENT DOCUMENTS

| | | |
|---|---|---|
| EP | 0 690 523 | 1/1996 |
| FR | 2 771 219 | 5/1999 |
| GB | 2 102 635 | 2/1983 |
| GB | 2 129 630 | 5/1984 |
| GB | 2 168 858 | 6/1986 |
| GB | 2 176 062 | 12/1986 |
| GB | 2 260 036 | 9/1991 |
| GB | 2 261 773 | 5/1993 |
| GB | 2 287 367 | 9/1995 |
| GB | 2 293 699 | 4/1996 |
| GB | 2 296 393 | 6/1996 |
| GB | 2 303 500 | 2/1997 |
| GB | 2 320 144 | 6/1998 |
| GB | 2 329 287 | 3/1999 |
| WO | WO 96/24960 | 8/1996 |
| WO | WO 02/11249 | 2/2002 |

OTHER PUBLICATIONS

Scotchlok 211 Trim-Out Connector, Instruction Bulletin, Issue 2, Nov. 1987, 2 pgs.

3M Scotchlok 211 Trim-Out Connector, 1996, 2 pgs.

* cited by examiner

BRIDGING CONNECTOR

CROSS REFERENCE TO RELATED APPLICATIONS

This application is a continuation of U.S. patent application Ser. No. 10/799,338, filed Mar. 12, 2004 now U.S. Pat. No. 7,018,230, which is incorporated herein in its entirety.

FIELD OF INVENTION

The present invention relates to electrical connectors, in particular a stackable electrical bridging connector for use with telecommunication systems.

BACKGROUND

The typical telephone communications system includes a large number of telephone wires coming from the telephone company, termed distribution wires, which can either be in the form of multi-wire buried cable or aerial cable. These wires must be connected to particular wires extending to telephones at particular sites. Terminal blocks are typically used to connect the large number of multiple wire pairs. Such terminal blocks typically connect from 1 to 50 individual service wire pairs to the distribution cable that may have several thousand-wire pairs. Generally, the terminal block is spliced to the distribution cable through a splicing cable or stub cable that forms part of the terminal block. The customer service wires are then connected to the terminal blocks through some type of terminal, which, ideally, enables the service wires to be easily connected, tested, disconnected and reconnected on site.

As new telephones are installed in a locality, an end or each phone wire is coupled or terminated to an appropriate terminal on the terminal block. Where insulated wires are to be terminated in the field, the conductors of the insulated wires need to be easily installed or affixed to the terminal. As many wires are required for operation, it is essential that the installation of the wires be accomplished with minimal effort and tooling. Generally, such terminal blocks include stub cables previously affixed thereto with discrete wires joined at one end to respective terminals in the block and the terminations sealed such as by potting. The terminated ends of the discrete wires of the stub cable are then spliced in the field to the appropriate ones of the distribution wires outside of the terminal block in a spliced closure.

Insulated wires within the industry are not always the same gauge and therefore the connectors and terminals must be designed to accommodate more than one wire size. A typical size wire, running from the terminal block to the phone installation can be a copper-clad steel wire with a gauge of about 18½ AWG (F-drop wire), or a solid copper wire having a gauge of about 19 to 26 AWG having a considerable thinner insulation jacket than the 18½ AWG gauge wire. It can be appreciated, that a connector having a higher quality means for terminating conductors, and having a means to accommodate more than one insulated wire size is desirable.

One type of connector used for in-line splicing of telecommunication wires is the discrete connector. The discrete connector is primarily used for in-line or ½ tap slicing (or bridge splicing) of telecommunication wire pairs. The discrete connector typically includes a pair of insulation displacement connectors (IDC), which are encased in a plastic housing. The discrete connection is typically a one-time use connector, which provides no protection against power surges cause by lightning or other electrical surges. In addition, the discrete connector often does not include any means for testing the electrical circuit from either the central office or to the customer.

Accordingly, it would be desirable to have an electrical bridging connector assembly that is easily installed, provides reusability, and a means to test the connection from the central office and to the customer.

SUMMARY

In accordance with one embodiment, a stackable bridging connector comprises: a pair of contact members, each comprising a first termination end and a second termination end, the first termination end dimensioned to be received in a pair of receiving ports of an electrical connector; and a connector having a pair of wire receiving passages, the wire receiving passages movable between a first position in which a pair of wires are held apart from the second termination end and a second position in which the pair of wires are inserted into the second termination end.

In accordance with an alternative embodiment, a stackable bridging connector comprises: a pair of contact members, each comprising a first termination end and a second termination end, the first termination end dimensioned to be received in a pair of receiving ports of an electrical connector and the second termination ends have a self-stripping slot formed therein configured to receive a wire having an insulation protective coating; and a connector having a pair of wire receiving passages, the wire receiving passages movable between a first position in which a pair of wires are held apart from the second termination end and a second position in which the pair of wires are inserted into the second termination end.

In accordance with another embodiment, a method of connecting two wire pairs comprises: providing a stackable bridging connector comprising: a pair of contact members, each comprising a first termination end and a second termination end, the first termination end dimensioned to be received in a pair of receiving ports of an electrical connector; and a connector having a pair of wire receiving passages, the wire receiving passages movable between a first position in which a pair of wires are held apart from the second termination end and a second position in which the pair of wires are inserted into the second termination end; inserting the first termination end of the bridging connector into a pair of receiving ports of an electrical connector; inserting a first wire pair into the wire receiving passages of the bridging connector; and moving the connector form the first position in which the second pair of wires are held apart from the second termination end to the second position in which the second pair of wires are inserted into the second termination end.

DETAILED DESCRIPTION

Figure 1:
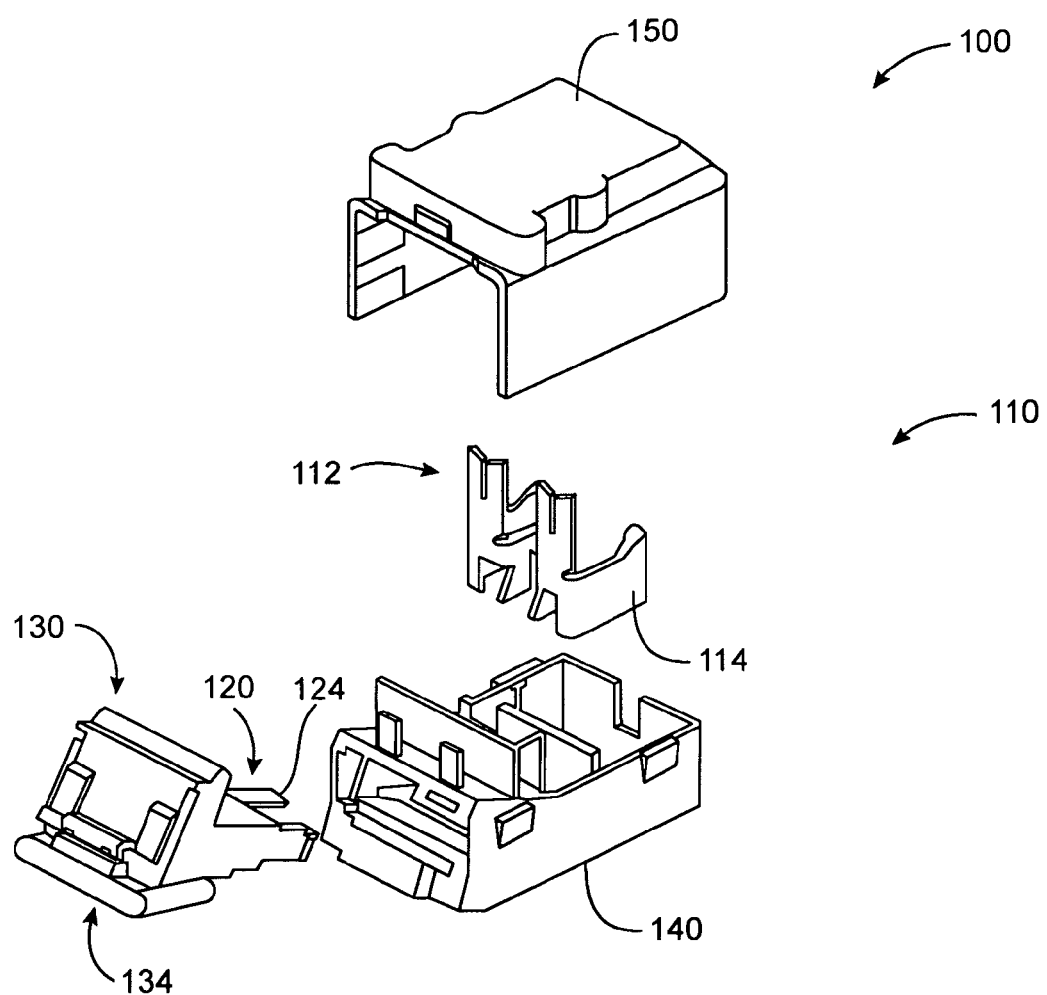
FIG. 1 shows an exploded perspective view of an electrical connector assembly according to one embodiment.

FIG. 1 shows an exploded perspective view of an electrical connector assembly 100 according to one embodiment. The electrical connector assembly 100 includes a first pair of contact members 110, a second pair of contact members 120, and connector 130 having a pair of wire receiving passages 136.

As shown in FIG. 1, the first pair of contact members 110 each has a first termination end 112 and a first connection end 114. The first termination end 112 can be an insulation displacement connector (IDC) configured to receive an insulated wire or any other suitable connector adapted to receive an insulated wire. The termination end 112 preferably pierces the insulation of the insulated wire, removing the insulation from the wire. The first connection end 114 is configured to electrically connect the first pair of contact members 110 to the second pair of contact members 120.

The second pair of contact members 120 each has a second termination end 122 and a second connection end 124. The first termination end 122 also can be an insulation displacement connector (IDC) or other suitable connector adapted to receive an insulated wire.

Figure 2A:
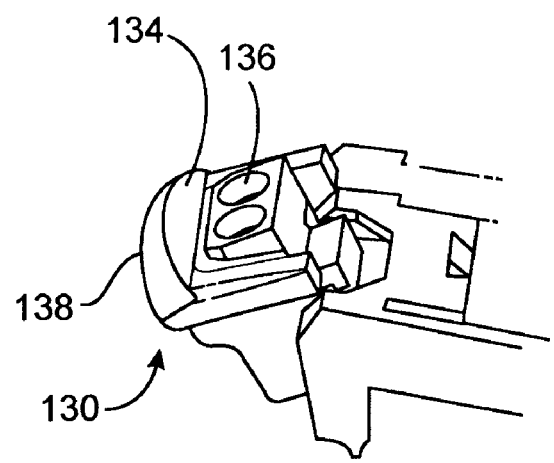
FIG. 2A shows a perspective view of a connector in a first position in which a pair of wires is held apart from the termination end.
Figure 2B:
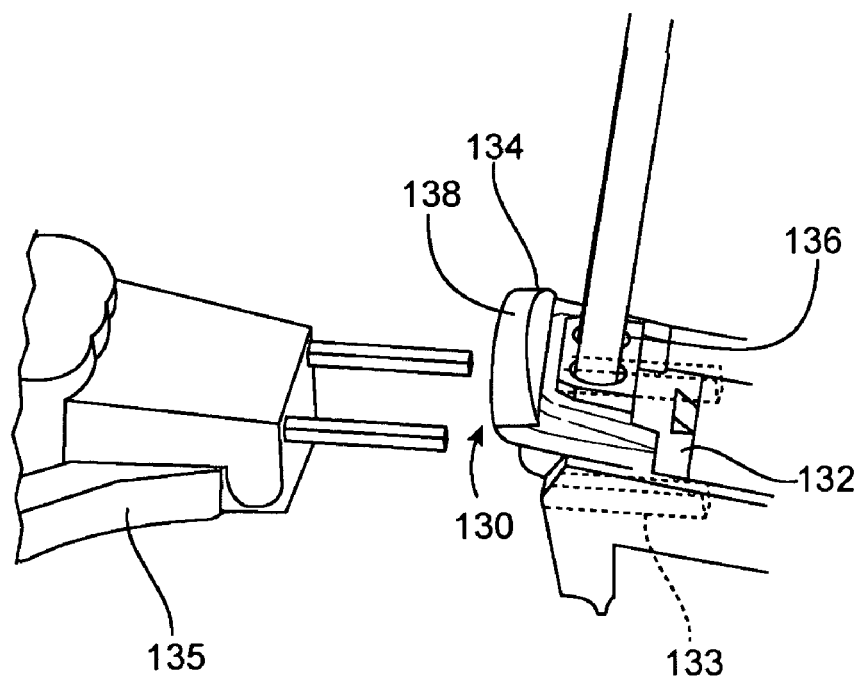
FIG. 2B shows a perspective view of a connector in a second position in which a pair of wires is inserted into the termination end.

As shown in FIGS. 2A and 2B, the assembly 100 also includes a connector 130 having a pair of wire receiving passages 136 movable between a first position in which a pair of wires are held apart from the second termination end 124 and a second position in which the pair of wires are inserted into the second termination end 124. FIG. 2A shows a perspective view of a connector in a first position in which a pair of wires is held apart from the second termination end 124. FIG. 2B shows a perspective view of a connector in a second position in which a pair of wires is inserted into the second termination end 124.

The first termination end 114 and the second termination end 124 generally will accept wires having a gauge of about 26 AWG to about 18½ AWG (about 0.4 to 0.9 mm). The outer diameter of the wires including insulation can be up to about 2.06 mm for standard telephone wires. However, it can be appreciated that the assembly 100 can be designed to accommodate wires having other gauges including Category 3, 5, and 6 broadband wires. In addition, the assembly 100 is designed to accommodate wires of different gauges. For example, in one embodiment, the first termination end 114 can accept a pair of wires having an 18½ AWG gauge (F drop wire), while the second termination end 24 can accept a pair of wires having a 24 AWG gauge (Standard telephone wire).

The connector 130 includes a body member 132 and a receptacle 134. The receptacle 134 including the pair of wire receiving passages 136. The wire receiving passages 136 being movable between the first position in which the wires are held apart from the second termination end 124 and the second position in which the wires are inserted into the second termination end 124. The receptacle 134 can include a handle 138 adapted to move the wire receiving passages 136 to either the first or the second position. The connector 130 is capable of removing the pair of wires from the second termination end 124 and reinserting the pair of wires into the second termination end 124.

Provided within the body member 132 of the connector 130 is the second pair of contact members 120. The second contact members 120 are preferably IDC connectors, positioned such that movement of the housing to the second position causes an inserted wire to be engaged by the IDC connector. In addition, movement of the receptacle 134 back to the first position disengages the wire from the IDC connector. For example, the connector 130 can be a mini-rocker switch as manufactured and sold by Channell Communications, Temecula, Calif., which allows the connector assembly 100 to be a multiple use assembly, rather than a single use assembly.

In operation, a pair of wires is inserted into the wire receiving passages 136 in the first position where the wires are held apart from the second termination ends 124. The technician grasps the handle 138 of the receptacle 134 and pushes the handle forward causing the wire receiving passages 136 and receptacle 134 to move to the second position. In the second position, the IDC connector engages the pair of wires. If the technician desires to remove the pair of wires from engagement with the IDC connector, the handle 138 of the receptacle 134 is pushed downward releasing the ends of the wires from engagement with the IDC connector. The pair of wires is then removed from the wire receiving passages 136. If re-entry is desired, the ends of the wire are preferably cut at a distance of about 10 mm and the wires are then re-inserted into the wire receiving passages 136. Alternatively, a second pair of wire can be re-inserted into the wire receiving passages 136 and pushing forward the handle 138 to engage the second pair of wires with the IDC connector.

In addition, the connector 130 includes a test port 133 configured to receive a test clip 135. The test clip 135 allows the technician to test the electrical connector assembly 100 for electrical signals from the central office ("C.O.") and for service to the customer. If the technician wants to test only the central office line, the connector 130 is placed in the first position in which the wires are held apart from the second termination end 124 and the test clip 135 is inserted into the test port 133. Alternatively, if the technician wants to test both the central office line and the outgoing service line to the customer, the connector 130 can be placed in the second position in which the wire are engaged with the IDC connector and the test clip 135 inserted into the test port 133.

The assembly 100 can also include a base member 140 adapted to receive the first pair of contact members 110 and the second pair of contact members 120, and a cap member 150. Preferably, the base member 140 includes a first receiving slot 142 adapted to receive the first pair of contact members 110 and a second receiving slot 144 adapted to receive the second pair of contact members 120. The first receiving slot 142 and the second receiving slot 144 are arranged such that the first and second pairs of contact members 110, 120 are electrically connected.

The electrical connector 100 also includes a cap member 150. The cap member 150 is configured to overlie the first contact member 110 and the second contact member 120. The cap member 150 can include at least two openings 152 configured to receive a pair of wires. The cap member 150 is configured to urge a portion of a wire onto the first termination ends 112. In operation, a pair of wires is inserted through the at least two opening 152 into the electrical connector 100. The pair of wires is positioned in the connector such that when cap member 150 is engaged with the base member 140, the cap member 150 urges the pair of wires onto the termination ends 112. Preferably, the termination ends 112 are insulation displacement connectors, which remove the insulation from the pair of wires.

The cap member 150 can be a snap fit or otherwise engagable with the remainder of the housing by any suitable means for connecting the cap member 150 to the base member 140.

The base member 140 can also include at least one retaining structure configure to retain a wire in the electrical connector assembly 100. The at least one retaining structure provides a pre-crimping feature which prevents the wire pairs from slipping out of assembly 100 before the cap member 150 has been crimped or engaged with the base member 140.

The electrical connector assembly 100 can also include a factory-installed sealant for insulating against corrosion and sealing out moisture. The factory-installed sealant can be a high viscosity-sealing compound that ensures protection of the connections, excellent installation resistance, and good electrical performance even in extreme environmental conditions. Alternatively, the assembly 100 can be unfilled for internal plant applications or other desired situations where a sealant is not desired.

Figure 3:
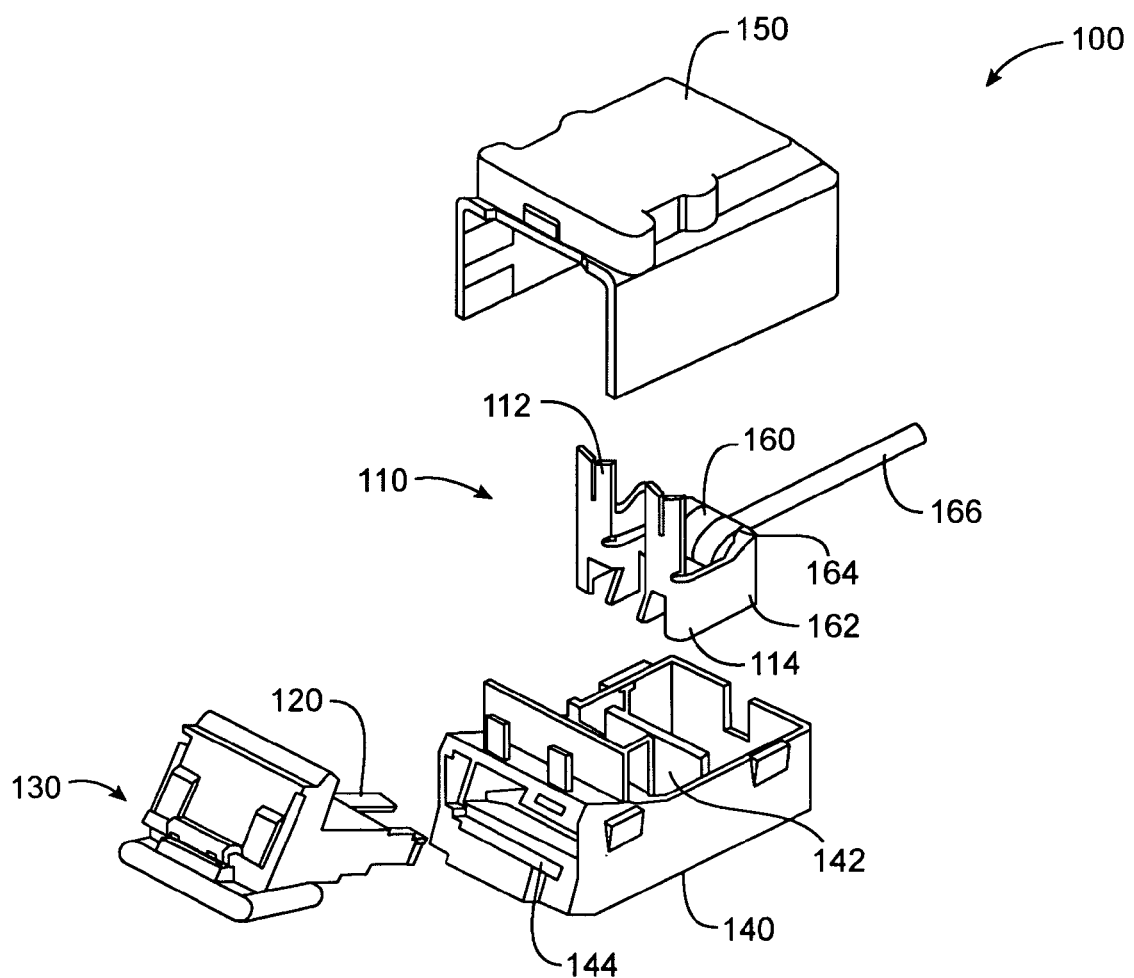
FIG. 3 shows another exploded perspective view of an electrical connector assembly according to another embodiment.

FIG. 3 shows an alternative embodiment of the electrical connector of FIG. 1. As shown in FIG. 3, the electrical connector assembly 100 includes a first pair of contact members 110, a second pair of contact members 120, and a connector 130 having a pair of wire receiving passages 136, and a surge arrestor 160. The surge arrestor 160 is positioned between the first pair of contact members 110. The surge arrestor 160 protects the electrical connector from over-voltage, or over-current to the system. The surge arrestor 160 can act as a primary surge protector, wherein the surge arrestor 160 is configured to receive the initial voltage or current surge. Alternatively, the surge arrestor 160 can be a secondary surge protector, wherein the surge arrestor 160 receives the voltage or current surge after the voltage or current surge has been dissipated through a primary surge protector.

As shown in FIG. 3, the first pair of contact members 110 can further includes a pair of arrestor contacts 164 spaced so as to receive the surge arrestor 160. In this embodiment, the surge arrestor 160 is positioned between the pair of arrestor contacts 164. The surge arrestor 160 provides for overload protection for the electrical connector assembly 100.

In one embodiment, a grounding member 166, such as a wire, a bar, a strap, a barrel or tubular connector or other suitable metallic or polymeric conductive element, is attached to the surge arrestor 160. The surge arrestor 160 can be a metal oxide varistor (MOV), a gas discharge arrestor or gas tube, a fuse, a toroidal choke coil, diode, solid state, clamp, poly switch or any other suitable surge protector or surge suppressor.

In addition, the arrestor contacts 164 are preferably welded to the surge arrestor 160, however, it can be appreciated that any type of contact means including spring contacts can be used.

Figure 4:
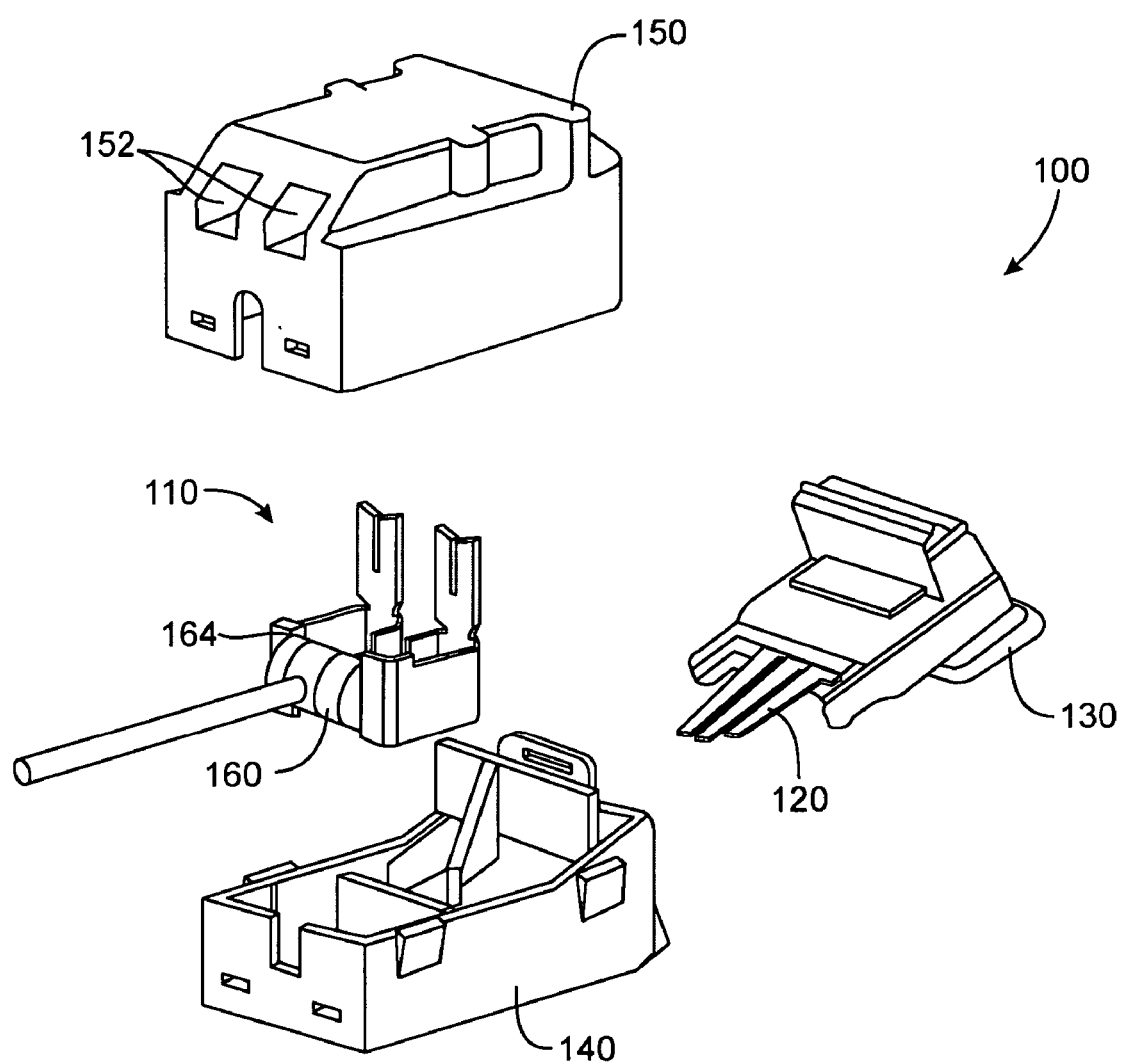
FIG. 4 shows an exploded perspective view of the electrical connector assembly of FIG. 3.

FIG. 4 shows another exploded perspective view of the electrical connector 100 having the surge arrestor 160 positioned between a pair of arrestor contacts 164. As shown in FIG. 4, the grounding member 166 is affixed to the surge arrestor 160 for added overload protection in over-load or over-current situations.

Figure 5:
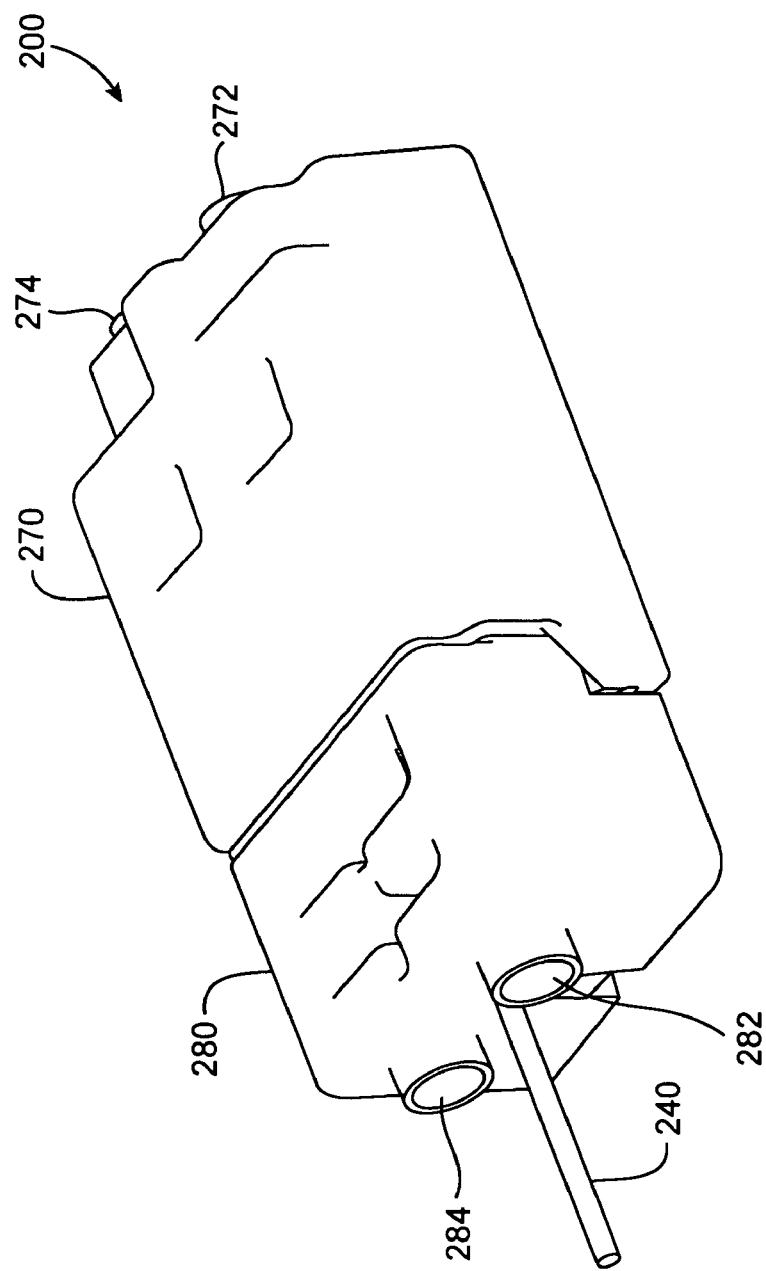
FIG. 5 shows a perspective view of an electrical connector according to an alternative embodiment.
Figure 6:
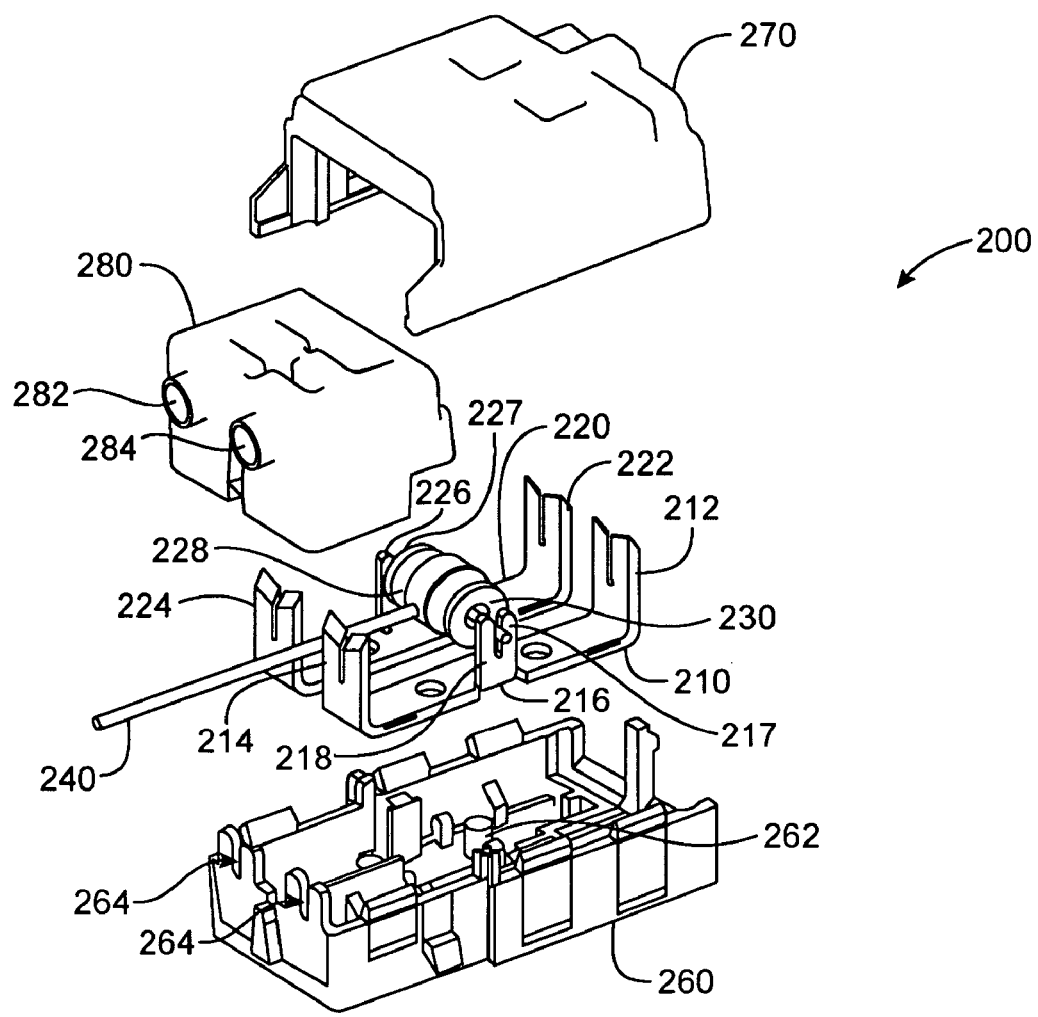
FIG. 6 shows an exploded perspective view of the electrical connector of FIG. 5.

FIGS. 5 and 6 show another embodiment of an electrical connector 200. As shown in FIGS. 5 and 6, the electrical connector 200 includes a pair of contact members 210, 220, a surge arrestor 230, and a grounding member 240 connected to the surge arrestor 230.

The contact members 210, 220, each have a self-stripping slot formed therein in the form of a first insulation displacement connector at a first end 212, 222 and a second insulation displacement connector at a second end 214, 224. The first and second insulation displacement connectors 212, 214, 222, and 224 are configured to enable two wire pairs to be linked. Each contact member 210, 220 include the first and second ends 212, 214, 222, 224, and a main body member 211, 221. The contact members 210, 220 also include a pair of contact arms 216, 226 attached to the main body member 211, 221 of each of the contact members 210, 220. The surge arrestor 230 is positioned between the contact arms 216, 226. In a preferred embodiment, each contact member 210, 220 is bent to form the first and second ends 212, 214, 222, 224.

The insulation displacement connectors 212, 214, 222, and 214 can extend in a direction substantially transverse to the main body member 211, 221 of the contact member 210, 220. The two contact arms 216, 226 also extend in a direction substantially transverse to the main body member 211, 221 of the contact members 210, 220 leading to a pair of arrestor contacts 218, 228.

The arrestor contacts 218, 228 are preferably spring contacts, thereby to enable replacement of the surge arrestor 230. However, if desirable the surge arrestor 230 can be welded to the contact arm 216, 226, provided in a slot 217, 227 as shown in FIG. 6 or affixed in any other suitable manner. In one embodiment, the contact arms 216, 226 and the contact members 210, 220 are not manufactured from a single piece of conductive material, but instead are joined together by welding or other means. By providing the contact arms 216, 226 as a separate piece and extending the contact arms 216, 226 from the edge of the main body members 211, 221 of the contact members 210, 220, this provides a particularly simple but effective electrical contact. In addition, this also avoids the need to bend a single-piece blank, thereby risking damage to or distribution of the IDC connector.

The surge arrestor 230 is positioned between the pair of surge arrestor contacts 218, 228. In one embodiment, a grounding member 240 can be connected to the surge arrestor 230 to provide added surge protection to the electrical connector 200. The grounding member 240 can be a wire, a bar, a strap, a barrel or tubular connector or other suitable metallic or polymeric conductive element.

As shown in FIGS. 5 and 6, the electrical connector 200 further includes a housing 250 to protect the contact members 210, 220 from outside elements including rain and snow. The housing includes a base 260, a first cap 270 and a second cap 280. The first cap 270 and the second cap 280 operate independent of each other and can be crimped or closed in any order or simultaneous. Thus, in operation, a pair of wires is inserted through a recess 282, 284 in the first cap 270 or second cap 280, which is then crimped to urge the insulated pair of wires onto the insulation displacement connectors of the contact members 210, 220.

The base 260 can also include a plurality of spindles 262 adapted to receive the contact members 210, 220. It can be appreciated the any means of securing the contact members 210, 220 in the base 260 can be used. The base 260 can also include at least one retaining structure 264 for retaining a wire in the electrical connector 200. The at least one retaining structure 264 provides a pre-crimping feature which prevents the wire pairs from slipping out of connector 200 before the first cap 270 or second cap 280 has been crimped.

In one embodiment, the insulation displacement connectors at the first end 212, 222 are adapted to receive a wire of about 18.5 to about 26 AWG. In addition, the insulation displacement connectors at the second end 214, 224 are configured to receive a wire of about 16 to about 19 AWG. Typically, the AWG wire is a plastic, paper or pulp insulated solid copper wire. However, the connector 200 can accept other suitable electrical conductors.

The first cap 270 has at least two openings (not shown) configured to receive a pair of wires. The second cap 280 has at least openings 282, 284 configured to receive a second pair of wires. The first cap 270 and the second cap 280 are configured to urge a portion of a wire onto the insulation displacement connectors 212, 214, 222, and 224.

As shown in FIGS. 5 and 6, the electrical connector 200 further includes a housing 250 to protect the contact members 210, 220 from outside elements including rain and snow. The housing 250 includes a base 260, a first cap 270 and a second cap 280. The first cap 270 and the second cap 280 operate independent of each other and can be crimped or closed in any order or simultaneous. Thus, in operation, a pair of wires is inserted through the openings 282, 284 in the first cap 270 or second cap 280, which is then crimped to urge the insulated pair of wires onto the insulation displacement connectors of the contact members 210, 220.

Figure 7:
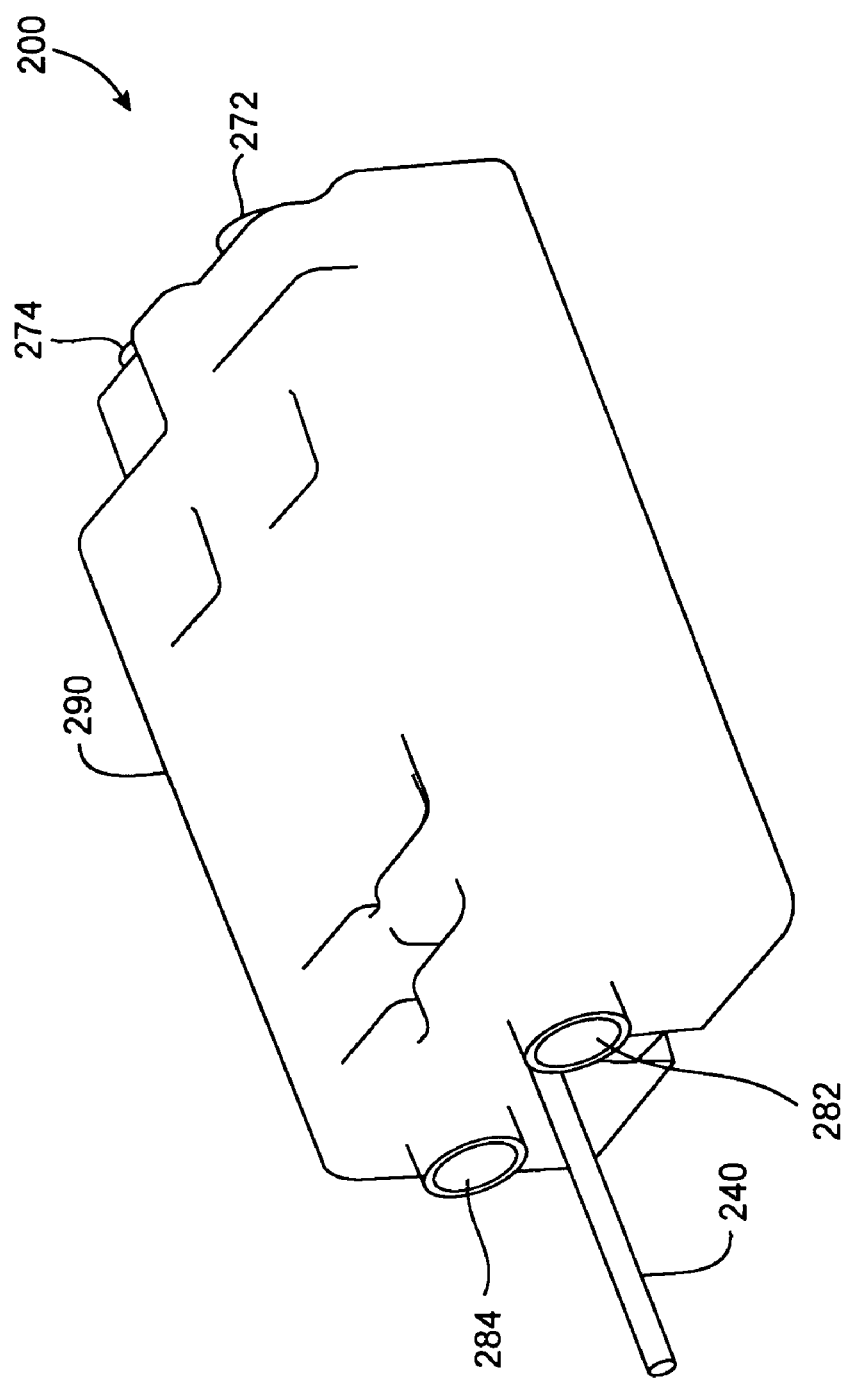
FIG. 7 shows a perspective view of an electrical connector according to a further embodiment.

FIG. 7 is another embodiment of the electrical connector 200 of FIG. 6 having a housing 250 to protect the contact members 210, 220 from outside elements including rain and snow. The housing 250 includes a base 260 and a single cap member 280. In this embodiment, the two pairs of wires are inserted through the openings 272, 274, 282, and 284 into the single cap member 290. The single cap member 290 is then crimped to urge the two insulated pairs of wires onto the insulation displacement connectors of the contact members 210, 220.

Figure 8:
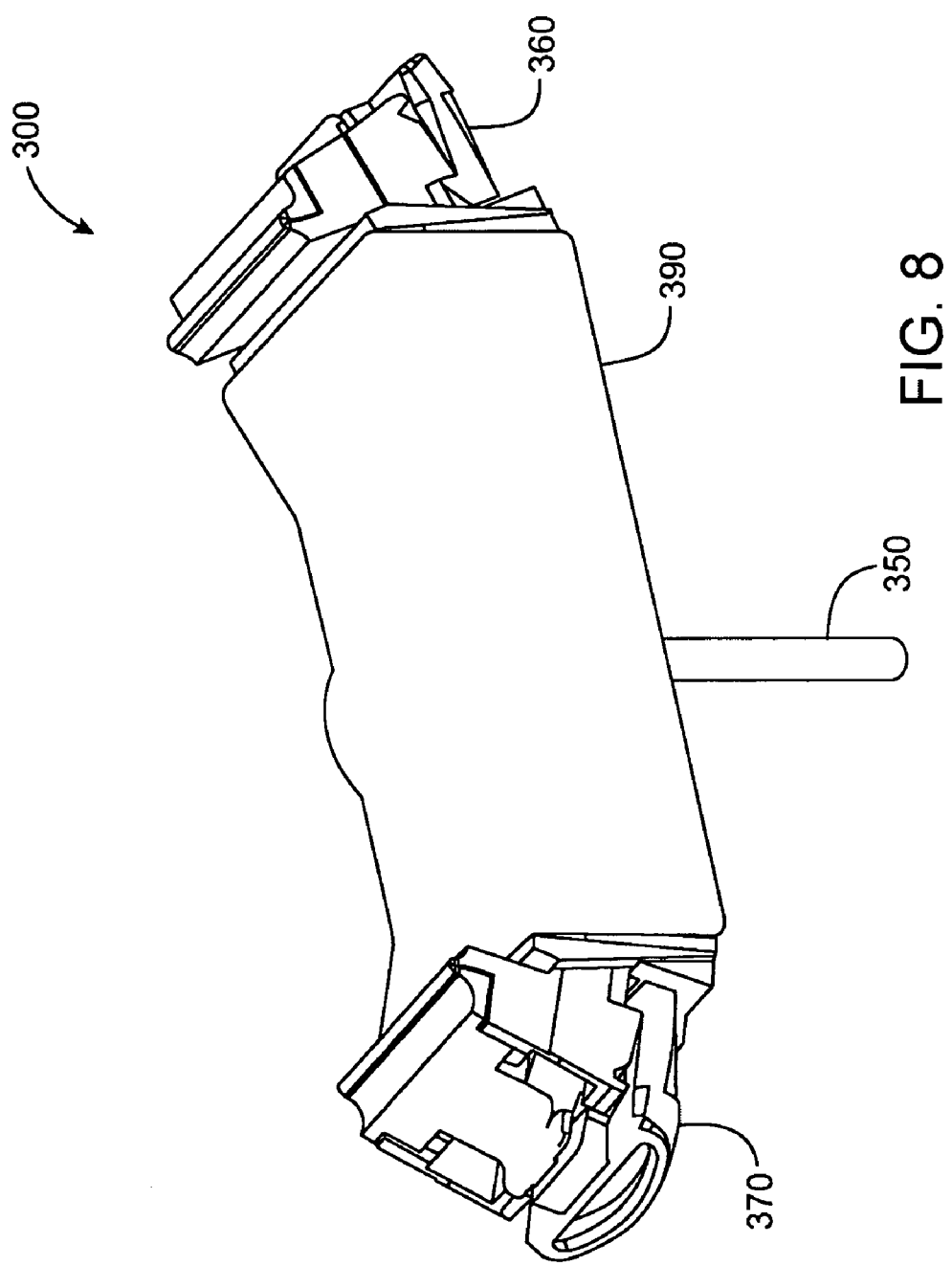
FIG. 8 shows a perspective view of an electrical connector assembly according to another embodiment.
Figure 9:
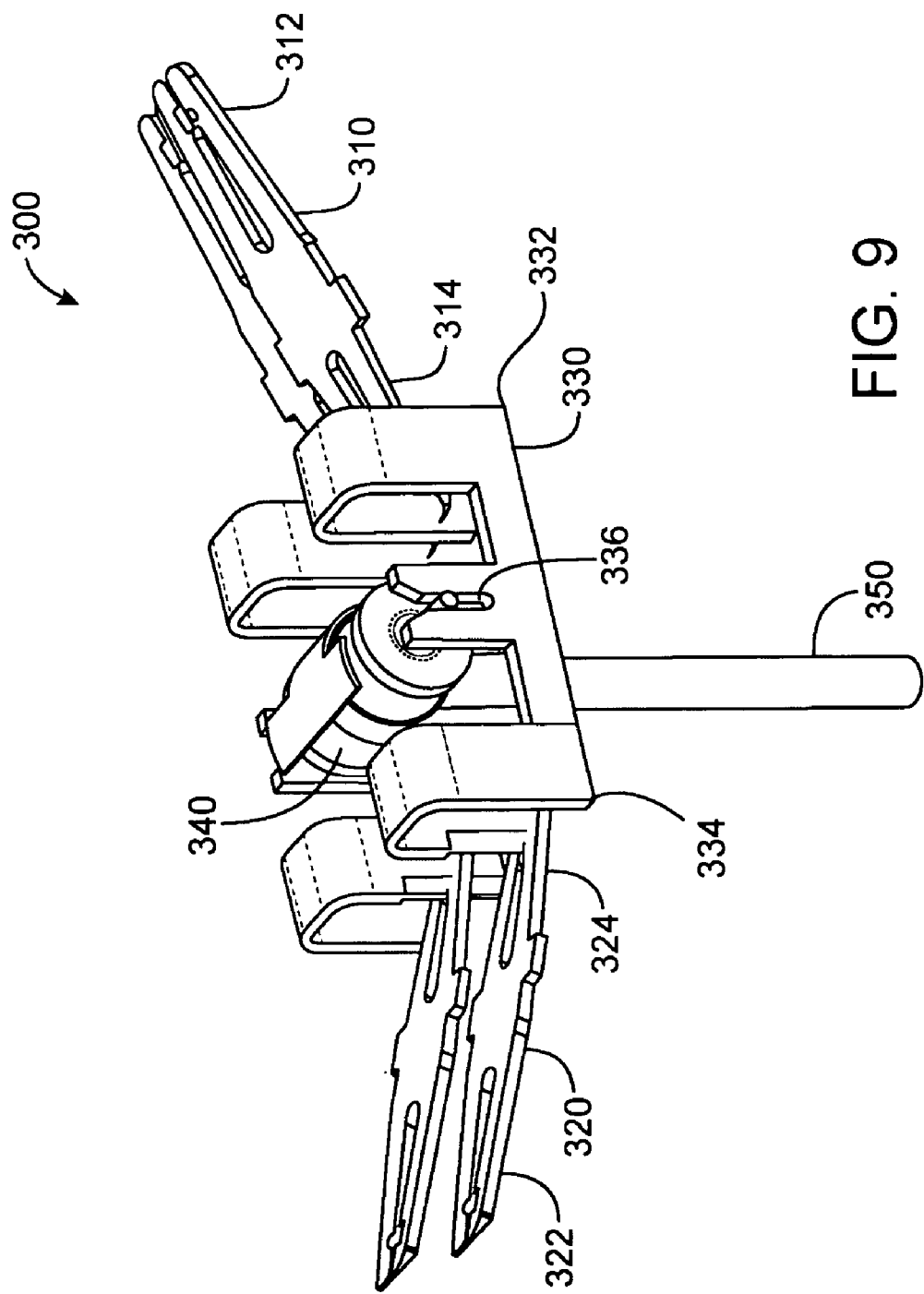
FIG. 9 shows an exploded perspective view of the electrical connector assembly of FIG. 8.

FIG. 8 shows a perspective view of an alternative embodiment of an electrical connector assembly 300. As shown in FIG. 9, the assembly 300 comprises a first pair of contact members 310, a second pair of contact members 320, and a pair of surge arrestor contact members 330, a surge arrestor 340 and a grounding member 350.

The first pair of contact members 310 each has a first termination end 312 and a first connection end 314. The first termination end 312 can be an insulation displacement connector (IDC) configured to receive an insulated wire or any other suitable connector adapted to receive an insulated wire. The first termination end 312 preferably pierces the insulation of the insulated wire, removing the insulation from the wire. The first connection end 314 is configured to electrically connect the first pair of contact members 310 to the second pair of contact members 320 via the pair of arrestor contact members 330.

The second pair of contact members 320 each has a second termination end 322 and a second connection end 324. The first termination end 322 also can be an insulation displacement connector (IDC) or other suitable connector adapted to receive an insulated wire.

Figure 10:
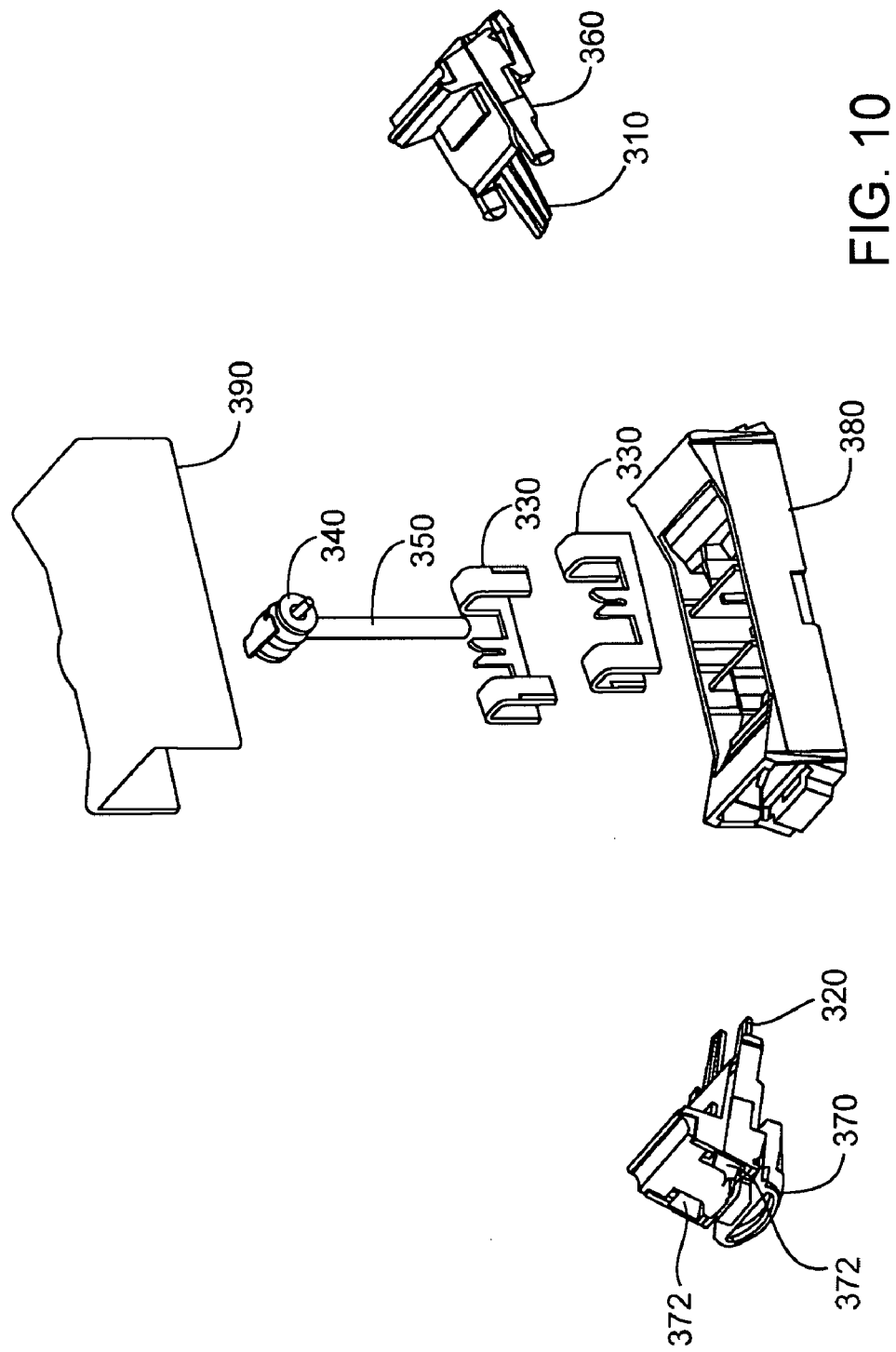
FIG. 10 shows another exploded perspective view of the electrical connector assembly of FIG. 8.

In one embodiment as shown in FIG. 10, the first contact member 310 and the second contact member 320 are encased in a first connector 360, and a second connector 370, respectively. Each connector 360, 370 has a pair of wire receiving passages movable between a first position in which a pair of wires are held apart from the termination end and a second position in which the pair of wires are inserted into the termination end. FIG. 2A shows a perspective view of a connector in a first position in which a pair of wires is held apart from the termination end. FIG. 2B shows a perspective view of a connector in a second position in which a pair of wires is inserted into the termination end. The connectors 360, 370 are capable of removing the pair of wires from the termination end and reinserting the pair of wires into the termination end.

The first termination end 314 and the second termination end 324 generally will accept wires having a gauge of about 26 AWG to about 18½ AWG (about 0.4 to 0.9 mm). The outer diameter of the wires including insulation can be up to about 2.06 mm for standard telephone wires. However, it can be appreciated that the assembly 300 can be designed to accommodate wires having other gauges including Category 3, 5, and 6 broadband wires. In addition, the assembly 300 is designed to accommodate wires of different gauges.

Provided within the body member of the connectors 360, 370 are the pair of contact members 310, 320. The contact members 310, 320 are preferably IDC connectors, positioned such that movement of the housing to the second position causes an inserted wire to be engaged by the IDC connector. In addition, movement of the receptacle back to the first position disengages the wire from the IDC connector. For example, the connector can be a mini-rocker switch as manufactured and sold by Channell Commercial Corporation, Temecula, Calif., which allows the connector assembly to be a multiple use assembly, rather than a single use assembly.

A pair of surge arrestor contact members 330 is configured to receive the first and second connection ends 312, 322 of the first pair of contact members 310 and the second pair of contact members 320, respectively. In one embodiment, the first connection end 312 of the first pair of contact members 310 is connected to a first end 342 of the surge arrestor contact members 330 and the second connection end 322 is connected to a second end 344 of the surge arrestor contact member 330.

A surge arrestor 340 is positioned between the pair of surge arrestor contact members 330. The surge arrestor 340 is positioned between the pair of arrestor contact members 330. The surge arrestor 340 provides for overload protection for the electrical connector assembly 300. The surge arrestor 340 can be a metal oxide varistor (MOV), a gas discharge arrestor or gas tube, a fuse, a toroidal choke coil, diode, solid state, clamp, poly switch or any other suitable surge protector or surge suppressor. The surge arrestor 340 can be a primary surge protector or a secondary surge protector.

In one embodiment, the arrestor contact members 330 have an arrestor contact 336 configured to receive the surge arrestor 340. The arrestor contact 336 can be a self stripping slot such as an IDC type contact as shown in FIGS. 9 and 10, a spring contact or any other suitable contact.

In one embodiment, the grounding member 350 is attached to the surge arrestor 340. In addition, the arrestor contacts 332 are preferably welded to the surge arrestor 340, however, it can be appreciated that any type of contact means including spring contacts can be used. The grounding member 350 can be a wire, a bar, a strap, a barrel or tubular connector or other suitable metallic or polymeric conductive element.

A base member 380 is adapted to receive the first pair of contact members 310, the second pair of contact members 320 and the surge arrestor contact members 330, and a cap member 390 provide protection for the contact members 310, 320 from the outside elements including rain or snow, animals and other items that can harm or damage the connection.

Either or both of the connectors 360, 370 can includes a test port 372 (as shown in element 370) configured to receive a test clip. The test clip (as shown in FIGS. 2A and 2B) allows the technician to test the electrical connector assembly 300 for electrical signals from the central office ("C.O.") and for service to the customer. If the technician wants to test only the central office line, the connector 360, 370 is placed in the first position in which the wires are held apart from the first termination end 314 and/or the second termination end 324 and the test clip is inserted into the test ports 372. Alternatively, if the technician wants to test both the central office line and the outgoing service line to the customer, the connectors 360, 370 can be placed in the second position in which the wire are engaged with the IDC connector and the test clip inserted into the test ports 372.

Figure 11:
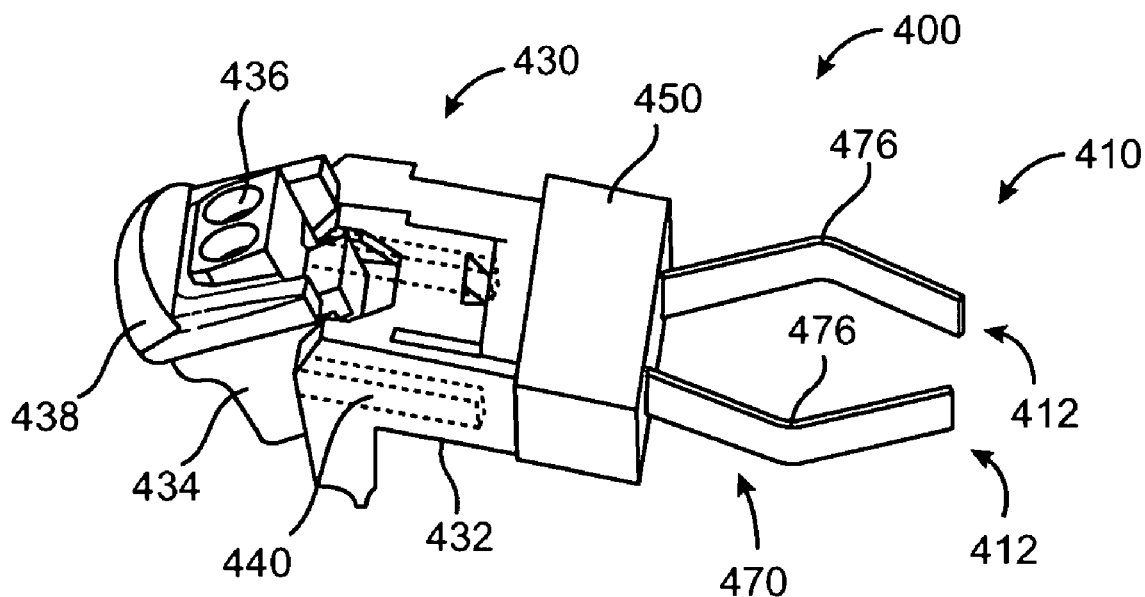
FIG. 11 shows a perspective view of an electrical bridging connector according to one embodiment.

FIG. 11 shows a perspective view of a stackable electrical bridging connector 400 in accordance with one embodiment. As shown in FIG. 11, the stackable electrical bridging connector 400 comprises a pair of contact members 410, each comprising a first termination end 412 and a second termination end 414 (FIG. 12), and a connector 430 having a pair of wire receiving passages 436. The bridging connector 400 includes a prong portion 470, which includes a pair of first termination ends 412, which are dimensioned to be received in a pair of test ports 133 of an electrical connector 130 as shown in FIGS. 2A and 2B. It can be appreciated that the test ports 133 of the electrical connector 130 can be configures to receive a pair of wires, a test clip or any other suitable device or apparatus having a pair of electrically extending prongs or wires. The connector 430 is comprised of a pair of wire receiving passages 436, which is movable between a first position in which a pair of wires (not shown) are held apart from the second termination end 414 and a second position in which the pair of wires are inserted into the second termination end 414.

As shown in FIG. 11, the bridging connector 400 includes a connector 430 having a pair of wire receiving passages 436 movable between a first position in which a pair of wires is held apart from the second termination end 414 and a second position in which the pair of wires is inserted into the second termination end 414. The connector 430 includes a body member 432 and a receptacle 434. The receptacle 434 includes the pair of wire receiving passages 436. As shown, the wire receiving passages 436 are movable between the first position in which a pair of wires (not shown) is held apart from the second termination end 414 and the second position in which the pair of wires is inserted into the second termination end 414 of the electrical contact 410. The receptacle 434 can include a handle 438 adapted to move the wire receiving passages 436 to either the first or the second position. The connector 430 is also capable of removing the pair of wires from the second termination end 414 and reinserting the pair of wires into the second termination end 414.

Provided within the body member 432 of the connector 430 is the second termination end 414 of the contact members 410. The second termination end 414 of the contact members 410 preferably includes a self-stripping slot 462 formed therein and configured to receive a wire (not shown) having an insulation or protective coating. The self-stripping slot 462 can be an insulation displacement connectors ("IDC") or suitable device, which receives a wire or electrical contact. The moveable wire receiving passages 436 in combination with the self-stripping slots 462 are positioned such that movement of the receptacle 434 to the second position causes an inserted wire to be engaged by the second termination end 414. In addition, movement of the receptacle 434 back to the first position disengages the wire from the second termination end 414. For example, the connector 430 can be a mini-rocker switch as manufactured and sold by Channell Commercial Corporation, Temecula, Calif., which allows the bridging connector 400 to be a multiple use assembly, rather than a single use assembly.

In operation, a pair of wires is inserted into the wire receiving passages 436 in the first position where the wires are held apart from the second termination ends 414. The technician grasps the handle 438 of the receptacle 434 and pushes the handle forward causing the wire receiving passages 436 and receptacle 434 to move to the second position. In the second position, the second termination ends 414 in the form of a self-stripping slot 462 or IDC connector engages the pair of wires. If the technician desires to remove the pair of wires from engagement with the second termination end 414 (or IDC connector), the handle 438 of the receptacle 434 is pushed downward releasing the ends of the wires from engagement with the second termination end 414 (IDC connector). The pair of wires is then removed from the wire receiving passages 436. If re-entry is desired, the ends of the wire are preferably cut at a distance of about 10 mm and the wires are then re-inserted into the wire receiving passages 436. Alternatively, a second pair of wire can be re-inserted into the wire receiving passages 436 and pushing forward the handle 438 to engage the second pair of wires with the second termination end 414 (or IDC connector).

The connector 430 can also include a pair of receiving ports 440. The pair of receiving ports 440 is dimensioned to receive the first termination end 412 of the bridging connector 400. Alternatively, the pair of receiving ports 440 can be dimensioned to receive a test clip 135 as shown in FIG. 2B. The test clip 135 allows the technician to test the bridging connector 400 for electrical signals from the central office ("C.O.") and for service to the customer. If the technician wants to test only the central office line, the connector 430 is placed in the first position in which the wires are held apart from the second termination end 414 and the test clip 135 is inserted into the pair of receiving ports 440. Alternatively, if the technician wants to test both the central office line and the outgoing service line to the customer, the connector 430 can be placed in the second position in which the wire are engaged with the second termination end 414 and the test clip 135 inserted into the receiving ports 440.

The connector also can include a housing 450, which is positioned between the connector 430 and the first termination end 412 of the contact member 410. The housing 450 provides support for the pair of contact members 410 within the connector 430.

Figure 12:
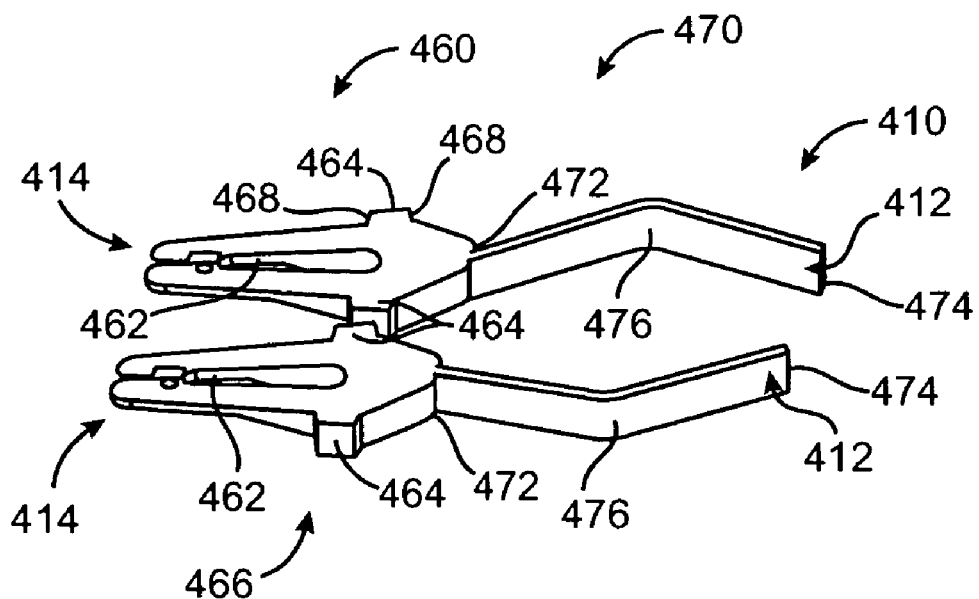
FIG. 12 shows a perspective view of the electrical contacts of the electrical bridging connector of FIG. 11.

FIG. 12 shows the pair of contact members 410 having a prong portion 470 and a self-stripping portion 460. The first termination end 412 and a second termination end 414 are the termination or end points of the prong portion 460 and the self-stripping portion 460 of the contact member 410, respectively. The contact member 410 is preferably comprised of a molded or stamped copper member, steel member with a copper coating, or the like wherein the contact member 410 has electrically conductive properties.

Figure 13:
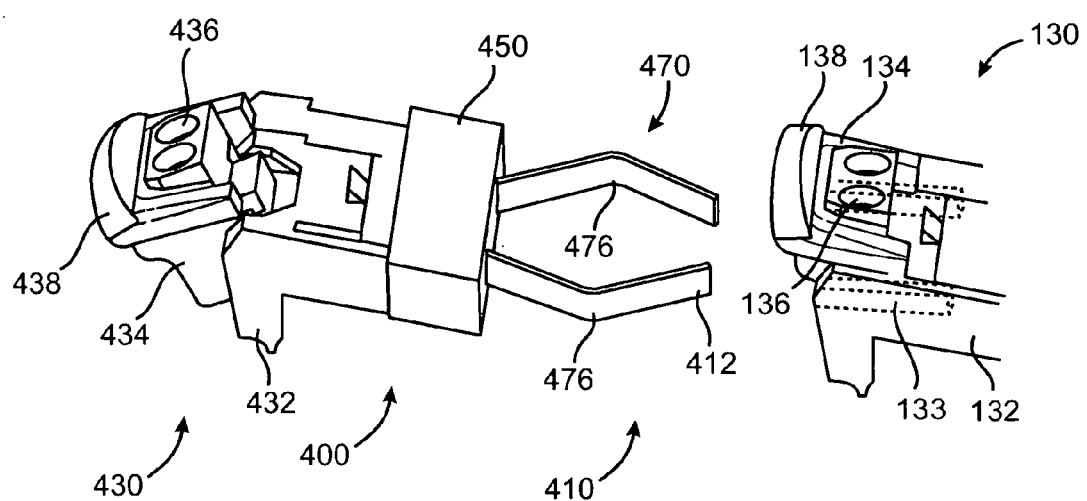
FIG. 13 shows an exploded perspective view of the electrical bridging connector of FIG. 11 in use with an electrical connector.

As shown in FIG. 12, the first termination ends 412, which are dimensioned to be received in a pair of receiving ports 440 of an electrical connector as shown in FIG. 13 or similar device or apparatus such as the Mini-Rocker® as sold by Channell Commercial Corporation of Temecula, Calif. The prong portion 470 of the bridging connector 400 is preferably comprised of a pair of angular prongs having a first end 472 and a second end 474. The first end 472 is preferably contained within the housing 450 of the bridging connector 400 and extends from the self-stripping portion 460 of the contact member 410. As shown in FIG. 12, the prong portion 470 preferably includes an angular or curved portion 476 between the first end 472 and the second end 474 of the prong portion 470. The angular or curved portion 476 allows the prong portion 470 to initially extend outward from the first end 472 and then inward towards the second end 474 of the prong portion 470. The angular or curved portions 476 in the prong portion 470 of the contact member 410 provide the bridging connector 400 with the ability to fit tightly within the wire receiving port 133 of an electrical connector 130. Alternatively, as shown in FIGS. 4-16, the prong portion 470 can have a relatively straight alignment for use with insulation displacement devices or an apparatus such as shown in FIGS. 2A and 2B.

As shown in FIG. 12, the second termination end 414 of the contact member 410 also includes the self-stripping portion 460, which is contained within the connector 430. The self-stripping portion 460 is comprised of a self-stripping slot 462 and a pair of electrical test plates 464. The self-stripping slot 462 can be any suitable insulation displacement connector (IDC) or other suitable connector adapted to receive an insulated wire. As shown in FIG. 12, the second termination end 414 is preferably an insulation displacement connector (IDC) configured to receive an insulated wire or any other suitable connector adapted to receive an insulated wire. The second termination end 414 preferably pierces the insulation of the insulated wire, removing the insulation from the wire.

The electrical test plates 464 are positioned towards a center portion 466 of the electrical contact member 410. The electrical test plates 464 extend outward from the center portion 466 of the self-stripping portion 460. As shown in FIG. 12, the electrical test plates 464 preferably are generally rectangular in shape having a pair of edges 468. The pair of edges 468 extend outward from the self-stripping portion 460 of the electrical contact member 410. The electrical test plates 464 provide a contact point for a test clip or other suitable device to test the electrical connection between the pair of electrical wires received within the second termination end 414. In addition, the electrical test plates 464 allows the technician to the test the electrical connection between the first termination end 412 and the wire receiving port 133.

It can be appreciated that the second termination end 414 can generally accept wires having a gauge of about 26 AWG to about 18½ AWG (about 0.4 to 0.9 mm). Typically, the outer diameter of the wires including insulation can be up to about 2.06 mm for standard telephone wires. However, it can be appreciated that the bridging connector 400 and/or second termination end 414 can be designed to accommodate wires having other gauges including Category 3, 5, and 6 broadband wires.

FIG. 13 shows an exploded perspective view of the bridging connector 400 as shown in FIG. 11 in use with a connector 130 having a pair test ports 133. As shown in FIG. 13, the bridging connector 400 includes a pair of contact members 410, which is dimensioned to be received in a pair of test ports 133 of an electrical connector 130. The test ports 133 of the electrical connector 130 is adapted to receive the connector 400, which allows more than a single pair of wires to be connected to a single electrical contact. As shown, a first pair of wires can be inserted into the pair of wire receiving passages 136 of the electrical connector 130 with a second pair of wires be insertable into the wire receiving passages 436 of the bridging connector 400. The pair of contact members 410 provides an electrical connection between the first termination end 412, which is dimensioned to be received in the pair of wire receiving ports 133 of the electrical connector 130 and the second termination end 414, which is adapted to receive a pair of wires.

Figure 14:
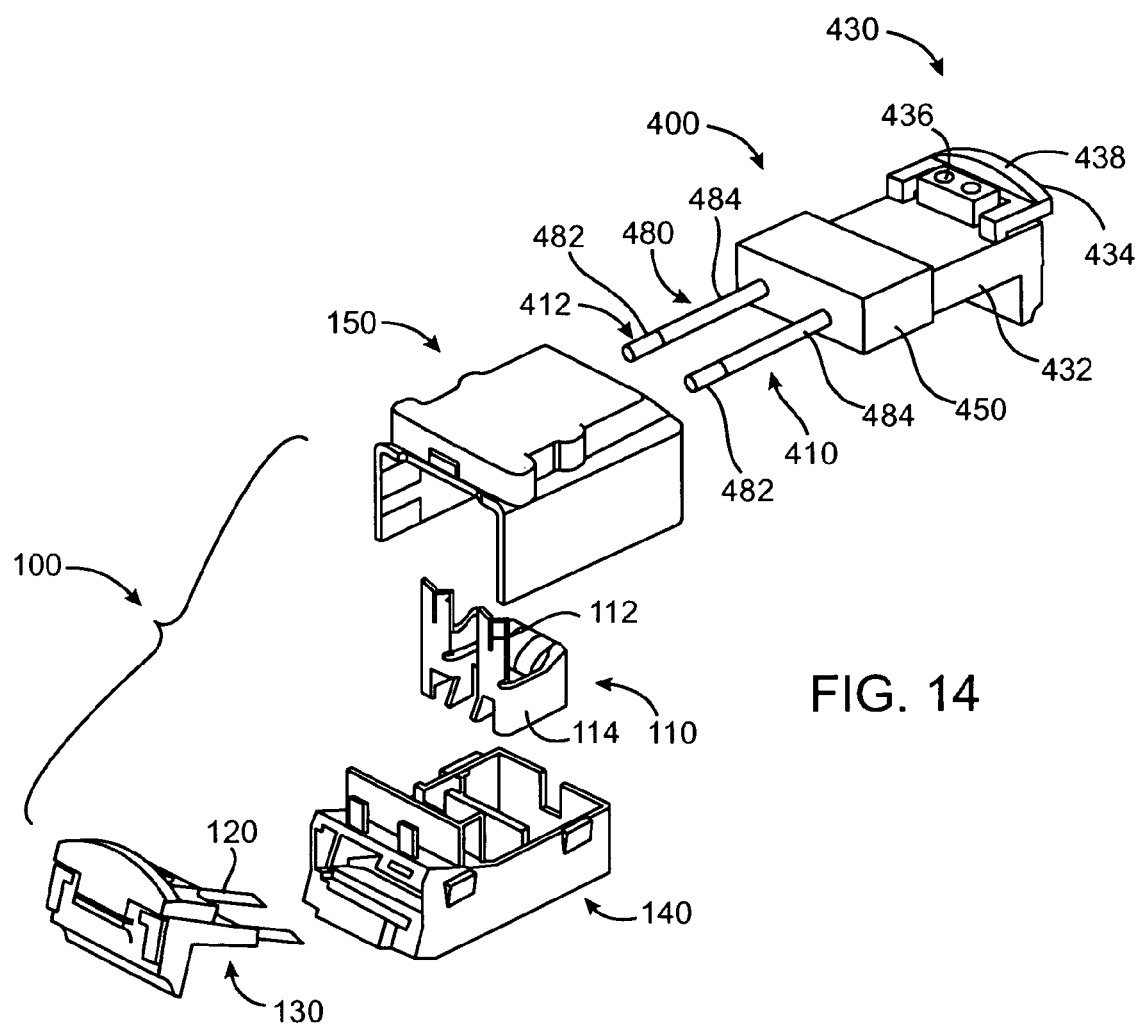
FIG. 14 shows a perspective view of an electrical bridging connector according to another embodiment.

FIG. 14 shows an alternative embodiment of an electrical bridging connector 400, which comprises a pair of contact members 410 and an electrical connector 430 and an electrical assembly 100 as shown in FIG. 3. The contact members 410 of the electrical bridging connector 400 are comprised of a first termination end 412 having an insulated electrical wire or contact 480, and a second termination end 414 (FIG. 15) having a self-stripping portion 460, which is configured to receive a pair of wires.

As shown in FIG. 14, the bridging connector 400 includes a connector 430 having a pair of wire receiving passages 436 movable between a first position in which a pair of wires is held apart from the second termination end 414 and a second position in which the pair of wires is inserted into the second termination end 414. The connector 430 includes a body member 432 and a receptacle 434. The receptacle 434 includes the pair of wire receiving passages 436. As shown, the wire receiving passages 436 are movable between the first position in which a pair of wires (not shown) is held apart from the second termination end 414 and the second position in which the pair of wires is inserted into the second termination end 414 of the electrical contact 410. The receptacle 434 can include a handle 438 adapted to move the wire receiving passages 436 to either the first or the second position. The connector 430 is also capable of removing the pair of wires from the second termination end 414 and reinserting the pair of wires into the second termination end 414.

Provided within the body member 432 of the connector 430 is the second termination end 414 of the contact members 410. The second termination end 414 of the contact members 410 preferably includes a self-stripping slot 462 formed therein and configured to receive a wire (not shown) having an insulation or protective coating. The self-stripping slot 462 can be an insulation displacement connectors ("IDC"). The moveable wire receiving passages 436 in combination with the self-stripping slots 462 are positioned such that movement of the receptacle 434 to the second position causes an inserted wire to be engaged by the second termination end 414. In addition, movement of the receptacle 434 back to the first position disengages the wire from the second termination end 414. For example, the connector 430 can be a mini-rocker switch as manufactured and sold by Channell Commercial Corporation, Temecula, Calif., which allows the bridging connector 400 to be a multiple use assembly, rather than a single use assembly.

As shown in FIG. 14, the assembly 100 is preferably comprised of a base member 140 adapted to receive a first contact member 110 having a first termination end 112 and a first connection end 114, and a connector 130. The first contact member 110 includes a first termination end 112 having a pair of self-stripping slots 112 in the form of an insulation displacement connector (IDC), which is configured to receive an insulated wire or any other suitable connector adapted to receive an insulated wire. The termination end 112 preferably pierces the insulation of the insulated wire, removing the insulation from the wire. The first connection end 114 is configured to electrically connect the first pair of contact members 110 to an electrical connector 130 having a second pair of contact members 120. The assembly 100 also includes a cap member 150, which is configured to overlie the first contact member 110 and the second contact member 120. The cap member 150 can include at least two openings (not shown) configured to receive a pair of wires and/or the first termination end 412 of an electrical bridging connector 400.

Figure 15:
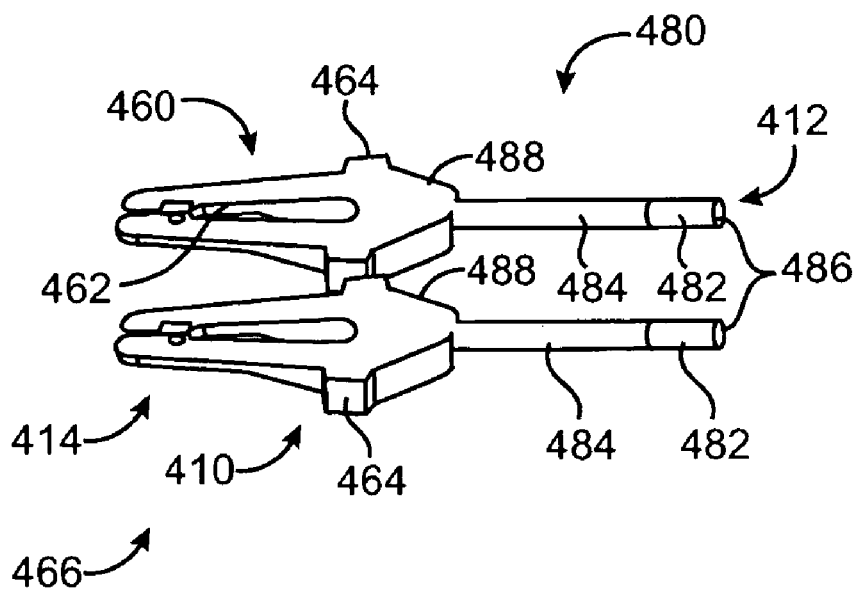
FIG. 15 shows a perspective view of the electrical contacts of the electrical bridging connector of FIG. 14.

FIG. 15 shows a perspective view of the electrical contact members 410 of the electrical bridging connector 400 of FIG. 14. As shown in FIG. 15, the insulated electrical wire or contact 480 is preferably dimensioned to be received in an electrical assembly 100 as shown in FIG. 14 and any other suitable IDC like connector. The contact member 410 is preferably comprised of any suitable electrically conductive material such as copper, steel with a copper coating, or the like wherein the member has electrically conductive properties. The insulated electrical wire or contact 480 comprises an electrically conductive wire 482 encapsulated in an electrical insulation 484. The electrically conductive wire 480 includes a first end 486 having an exposed or uninsulated electrically conductive wire 480 and a second end 488 having an electrical insulation 486 thereon. The second end 488 is connected to the self-stripping portion 460 of the electrical contact 410. The electrically conductive wire 482 is preferably 18.5 AWG to 26 AWG gauge wire, and more preferably 18.5 AWG gauge wire, also known as F-drop wire. However, it can be appreciated that any suitable electrically conductive wire can be used. For example, the electrical wires 482 can be Category 3, 5 or 6 wires/cables used in the transmission of broadband signals.

The electrical insulation 484 is preferably a plastic such as polyvinyl chloride (PVC), vulcanized rubber or a similar type of insulation material. If desired, the insulation material 484 can be a paper or pulp like material. For example, typical plastics include PVC and plenum. The electrical insulation 484 preferably extends to within about 0.125 to 0.50 of an inch of the first termination end 412 of the electrical contact member 410, and more preferably about 0.25 of an inch of the first termination end 412.

The second termination end 414 of the contact member 410 has a self-stripping portion 460. The self-stripping portion 460 is comprised of a self-stripping slot 462 and a pair of electrical test plates 464. The self-stripping slot 462 can be any suitable insulation displacement connector (IDC) or other suitable connector adapted to receive an insulated wire. As shown in FIG. 15, the second termination end 414 is preferably an insulation displacement connector (IDC) configured to receive an insulated wire or any other suitable connector adapted to receive an insulated wire. The second termination end 414 preferably pierces the insulation of the insulated wire, removing the insulation from the wire.

Figure 16:
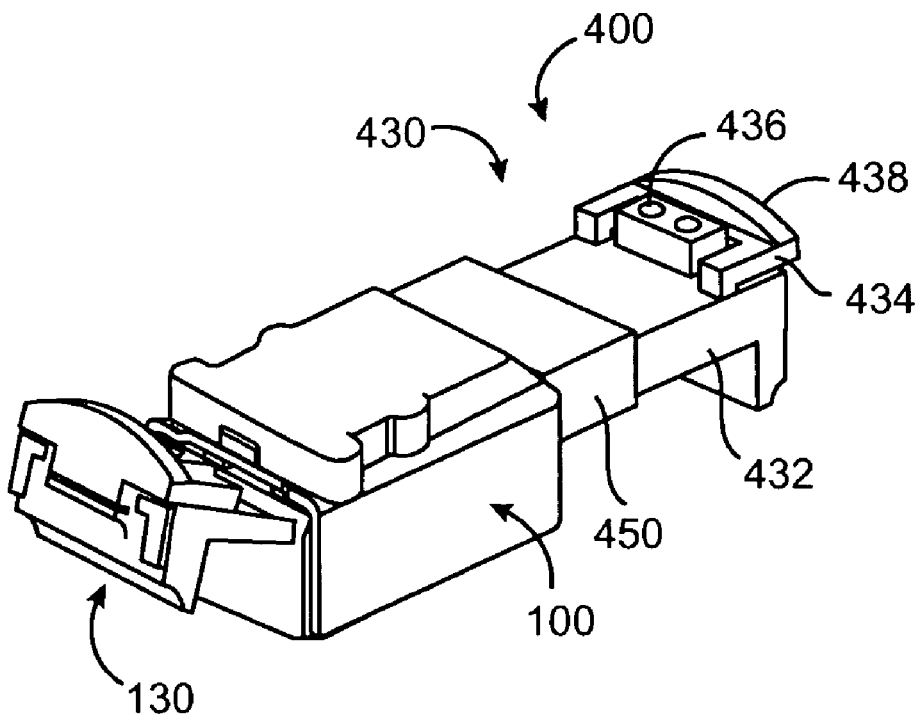
FIG. 16 shows an exploded perspective view of an electrical connector of FIG. 1 in use with an electrical bridging connector as shown in FIG. 14.

FIG. 16 shows an exploded perspective view of the electrical connector of FIG. 14 in use with an electrical assembly 100 as shown in FIG. 1. As shown in FIG. 16, the first pair of contact members 410 can have a relatively straight alignment and are inserted into at least two openings 152 (FIG. 4) with in the cap member 150. The cap member 150 is configured to urge a portion of the insulated wires 480 onto the first termination ends 112. In operation, the insulated wires 480 are inserted through the at least two opening 152 into the electrical connector 100. The pair of wires 480 is positioned in the connector such that when cap member 150 is engaged with the base member 140, the cap member 150 urges the pair of wires onto the termination ends 112. Preferably, the termination ends 112 are insulation displacement connectors, which remove the insulation from the pair of wires.

Although the present invention has been described in connection with preferred embodiments thereof, it will be appreciated by those skilled in the art that additions, deletions, modifications, and substitutions not specifically described can be made without departing from the spirit and scope of the invention as defined in the appended claims.

What is claimed is:

1. A stackable bridging connector comprising:
a pair of contact members, each comprising a first termination end and a second termination end, and wherein the first termination ends are angled towards one another forming an angular prong dimensioned to be received in a pair of receiving ports of an electrical connector, and wherein the second termination ends have a self-stripping slot formed therein configured to receive a wire having an insulation protective coating; and
a connector having a pair of wire receiving passages, the wire receiving passages movable between a first position in which a pair of wires are held apart from the second termination end and a second position in which the pair of wires are inserted into the second termination end.

2. The connector of claim 1, wherein the connector further includes a pair of receiving ports dimensioned to receive the first termination end of a stackable bridging connector or a test clip.

3. The connector of claim 1, further comprising a housing, wherein the housing is positioned between the connector and the first termination end of the pair of contact members.

4. The connector of claim 1, wherein the connector comprises a main body and a moveable receptacle, the moveable receptacle containing the wire receiving passages.

5. The connector of claim 1, wherein the self-stripping slots are dimensioned to accept a pair of wires having a gauge of about 19 to about 26 AWG.

6. The connector of claim 1, wherein the connector includes a factory-installed sealant configured to protect against corrosion and sealing out moisture.

7. The connector of claim 1, wherein the first termination ends comprise an insulated wire having a gauge of about 18.5 to 21 AWG.

8. The connector of claim 1, wherein the first termination ends comprise an insulated wire having a gauge of about 18.5 AWG.

9. The connector of claim 1, wherein the electrical connector has a pair of wire receiving passages, the wire receiving passages movable between a first position in which a pair of wires are held apart from the second termination end and a second position in which the pair of wires are inserted into the second termination end and a wire receiving port.

10. A stackable bridging connector comprising:
- a pair of contact members, each comprising a first termination end and a second termination end, the first termination end dimensioned to be received in a pair of receiving ports of an electrical connector; and
- a connector having a pair of wire receiving passages, the wire receiving passages movable between a first position in which a pair of wires are held apart from the second termination end and a second position in which the pair of wires are inserted into the second termination end, and wherein the electrical connector comprises:
  - a first pair of contact members, each comprising a first termination end and a first connection end;
  - a second pair of contact members, each comprising a second termination end and a second connection end, wherein the first connection end and the second connection end are in contact; and
  - a base member and a cap member, wherein the base member is configured to receive the first and second pairs of contact members, and the cap member is configured to urge the first termination end of the bridging connector into the first termination end.

11. The connector of claim 10, wherein the connector further includes a pair of receiving ports dimensioned to receive the first termination end of a stackable bridging connector or a test clip.

12. The connector of claim 10, further comprising a housing, wherein the housing is positioned between the connector and the first termination end of the pair of contact members.

13. The connector of claim 10, wherein the connector comprises a main body and a moveable receptacle, the moveable receptacle containing the wire receiving passages.

14. The connector of claim 13, wherein the self-stripping slots are dimensioned to accept a pair of wires having a gauge of about 19 to about 26 AWG.

15. The connector of claim 10, wherein the connector includes a factory-installed sealant configured to protect against corrosion and sealing out moisture.

16. The connector of claim 10, wherein the first termination ends are angled towards one another to form an angular prong.

17. The connector of claim 10, wherein the first termination ends comprise an insulated wire having a gauge of about 18.5 to 21 AWG.

18. The connector of claim 10, wherein the first termination ends comprise an insulated wire having a gauge of about 18.5 AWG.

19. The connector of claim 10, wherein the electrical connector has a pair of wire receiving passages, the wire receiving passages movable between a first position in which a pair of wires are held apart from the second termination end and a second position in which the pair of wires are inserted into the second termination end and a wire receiving port.

20. A stackable bridging connector comprising:
- a pair of contact members, each comprising a first termination end and a second termination end, the first termination end dimensioned to be received in a pair of receiving ports of an electrical connector and the second termination ends have a self-stripping slot formed therein configured to receive a wire having an insulation protective coating; and
- a connector having a pair of wire receiving passages, the wire receiving passages movable between a first position in which a pair of wires are held apart from the second termination end and a second position in which the pair of wires are inserted into the second termination end, and wherein the electrical connector comprises:
  - a first pair of contact members, each comprising a first termination end and a first connection end;
  - a second pair of contact members, each comprising a second termination end and a second connection end, wherein the first connection end and the second connection end are in contact; and
  - a base member and a cap member, wherein the base member is configured to receive the first and second pairs of contact members, and the cap member is configured to urge the first termination end of the bridging connector into the first termination end.

21. A method of connecting two wire pairs comprising:
providing a stackable bridging connector comprising:
- a pair of contact members, each comprising a first termination end and a second termination end, and wherein the first termination ends are angled towards one another forming an angular prong dimensioned to be received in a pair of receiving ports of an electrical connector, and wherein the second termination ends have a self-stripping slot formed therein configured to receive a wire having an insulation protective coating; and
- a connector having a pair of wire receiving passages, the wire receiving passages movable between a first position in which a pair of wires are held apart from the second termination end and a second position in which the pair of wires are inserted into the second termination end;
inserting the first termination end of the bridging connector into a pair of wire receiving ports of an electrical connector;
inserting a first wire pair into the wire receiving passages of the bridging connector; and
moving the connector form the first position in which the second pair of wires are held apart from the second termination end to the second position in which the second pair of wires are inserted into the second termination end.

22. The method of claim 21, wherein the electrical connector has a pair of wire receiving passages, the wire receiving passages movable between a first position in which a pair of wires are held apart from the second termination end and a second position in which the pair of wires are inserted into the second termination end and a pair of receiving ports dimensioned to receive the first termination end of a stackable bridging connector or a test clip.

23. The method of claim 22, further comprising inserting a second pair of wires into the pair of wire receiving passages of the electrical connector.

24. The method of claim 21, further comprising placing the connector in the first position in which the wires are held apart from the second termination and placing a test clip in a test port of the connector to test an electrical connection between a central office and the first termination end.

25. The method of claim 24, further comprising placing the connector in the second position in which the wires are engaged with the second termination end and placing a test clip in a test port of the connector to test the electrical connection between the central office and a customer.

26. A method of connecting two wire pairs comprising:
providing a stackable bridging connector comprising:
- a pair of contact members, each comprising a first termination end and a second termination end, the first termination end dimensioned to be received in a pair of receiving ports of an electrical connector; and a connector having a pair of wire receiving passages, the wire receiving passages movable between a first position in which a pair of wires are held apart from the second termination end and a second position in which the pair of wires are inserted into the second termination end and wherein the electrical connector comprises:

a first pair of contact members, each comprising a first termination end and a first connection end;

a second pair of contact members, each comprising a second termination end and a second connection end, wherein the first connection end and the second connection end are in contact; and a base member and a cap member, wherein the base member is configured to receive the first and second pairs of contact members, and the cap member is configured to urge the first termination end of the bridging connector into the first termination end;

inserting the first termination end of the bridging connector into a pair of wire receiving ports of an electrical connector;

inserting a first wire pair into the wire receiving passages of the bridging connector; and moving the connector form the first position in which the second pair of wires are held apart from the second termination end to the second position in which the second pair of wires are inserted into the second termination end.

27. The method of claim 26, further comprising closing the cap member onto the base member to urge the first termination end of the bridging connector into the first termination end of the electrical connector.

28. The method of claim 27, further comprising inserting a second two wire pair into the wire receiving passage of the connector.

29. A stackable bridging connector comprising:

a pair of contact members, each contact member comprised of a prong portion and a self-stripping slot portion, and wherein the prong portion is dimensioned to be received in a receiving port of an electrical connector and the self-stripping slot portion has a self-stripping slot formed therein configured to receive a wire having an insulation protective coating; and a connector having a pair of wire receiving passages, the wire receiving passages movable between a first position in which a pair of wires are held apart from the self-stripping slot and a second position in which the pair of wires are inserted into the self-stripping slot.

30. The connector of claim 29, wherein the connector further includes a pair of receiving ports dimensioned to receive the prong portion of a stackable bridging connector or a test clip.

31. The connector of claim 29, further comprising a housing, wherein the housing is positioned between the connector and the prong portion of the pair of contact members.

32. The connector of claim 29, wherein the connector comprises a main body and a moveable receptacle, the moveable receptacle containing the wire receiving passages.

33. The connector of claim 29, wherein the prong portion has a first end and second end, the first end attached to the self-stripping slot portion and wherein the second ends are angled towards one another forming an angular prong.

\* \* \* \* \*